(12) United States Patent
Vijayan et al.

(10) Patent No.: US 9,478,278 B1
(45) Date of Patent: Oct. 25, 2016

(54) READ-WRITE CONTENTION CIRCUITRY

(71) Applicant: ARM Limited, Cambridge (GB)

(72) Inventors: Rejeesh Ammanath Vijayan,
Bangalore (IN); Vikash, Bangalore
(IN); Pradeep Raj, Bangalore (IN);
Neelima Gudipati, Bangalore (IN);
Manish Trivedi, Bangalore (IN); **Sujit
Rout**, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/675,687

(22) Filed: Mar. 31, 2015

(51) Int. Cl.
*G11C 11/00* (2006.01)
*G11C 11/419* (2006.01)

(52) U.S. Cl.
CPC .................................. *G11C 11/419* (2013.01)

(58) Field of Classification Search
CPC ..... G11C 8/16; G11C 11/419; G11C 11/412;
G11C 11/413; G11C 11/1425
USPC .......... 365/154, 156, 230.02, 230.05, 230.08
See application file for complete search history.

(56) References Cited

U.S. PATENT DOCUMENTS

| | | | | |
|---|---|---|---|---|
| 5,742,557 A | * | 4/1998 | Gibbins | G11C 8/16 365/154 |
| 2002/0110024 A1 | * | 8/2002 | Ouellette | G11C 29/02 365/189.04 |

* cited by examiner

*Primary Examiner* — Tha-o H Bui
(74) *Attorney, Agent, or Firm* — Pramudji Law Group PLLC; Ari Pramudji

(57) ABSTRACT

Various implementations described herein are directed to an integrated circuit for read-write contention. The integrated circuit may include a memory circuit having multiple ports configured to receive data signals corresponding to each port. The integrated circuit may include a contention override circuit providing a contention override signal for each port based on detecting a read-write contention between the ports. The integrated circuit may include a write circuit having multiple passgates for each port including write passgates and contention passgates for each port. The write passgates may be input with data signals from corresponding ports. The contention passgates may be input with data signals from opposing ports based on opposing contention override signals.

20 Claims, 10 Drawing Sheets

200C

Port A
Contention Override Circuit 220A

Port B
Contention Override Circuit 220B

300C

READ-WRITE CONTENTION CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits include memory circuits to store and access data. A multi-port memory may have more than one port to access memory contents. During read and write operations, contention may occur when a read operation occurs at the same time of a write operation. Handling of contention scenarios may be difficult due to impact on frequency of operation.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to circuitry for read-write contention. For instance, such read-write contention circuitry may be implemented for handling read-write contention in various types of memory circuits, such as, e.g., static random access memory (SRAM) circuits, including dual port SRAM circuits. Such read-write contention may refer to having write operations succeed over read operations. Techniques for read-write contention described herein enable memory to operate at equal to or at least closer to the frequency of operation during read-write contention conditions when compared to non-contention conditions.

Various implementations of read-write contention circuitry described herein will now be described in more detail with reference to FIGS. 1-5.

Figure 1:
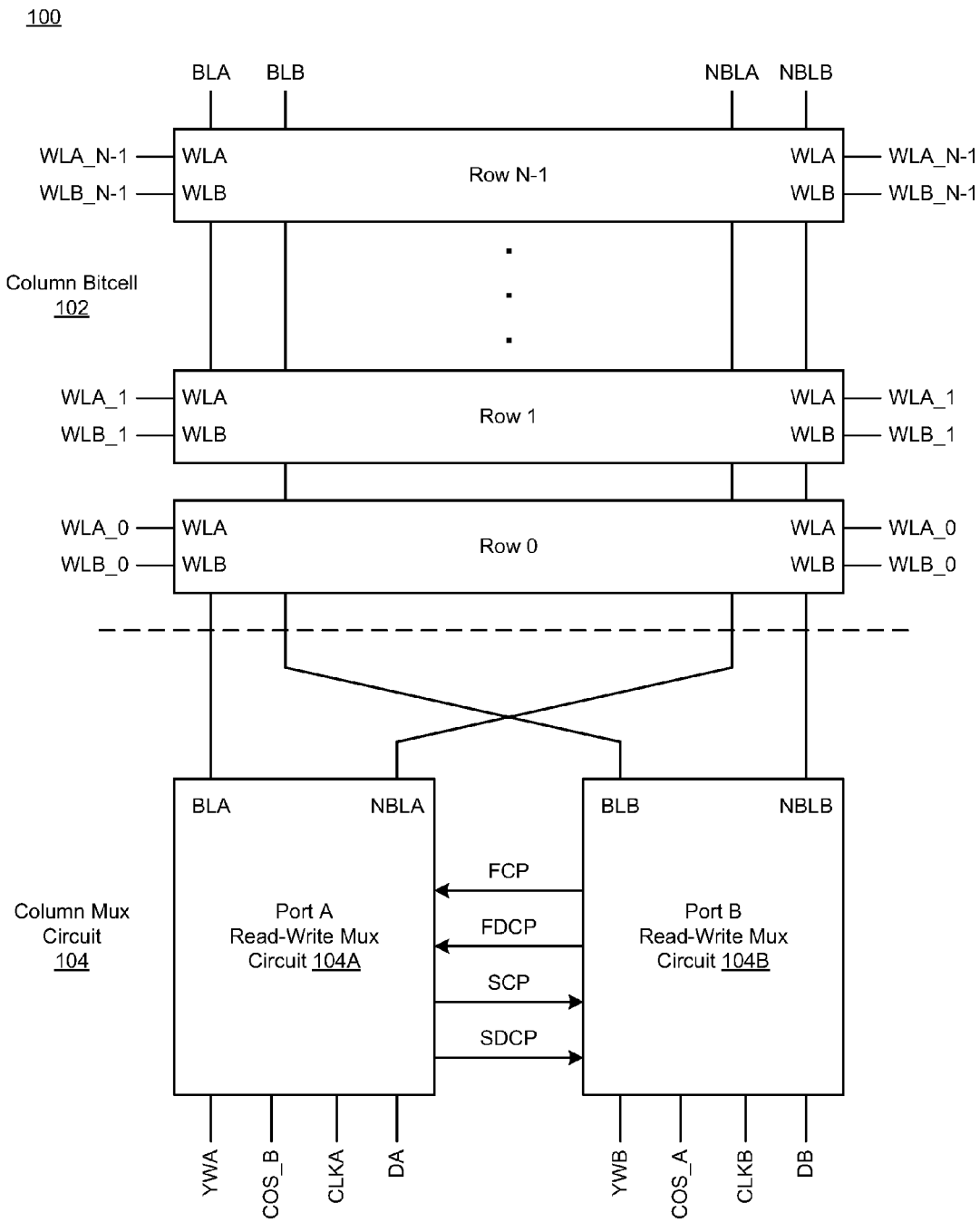
FIG. 1 illustrates a block diagram of memory circuitry in accordance with various implementations described herein.

FIG. 1 illustrates a block diagram of memory circuitry 100 in accordance with various implementations described herein.

The memory circuitry 100 may be an integrated circuit configured to store and access data. The memory circuit 100 may include a column bitcell 102 having multiple rows, including row 0, row 1, . . . , row N-1. The column bitcell 102 uses multiple wordlines WLA, WLB and multiple bitlines BLA, NBLA, BLB, NBLB to store and access data persisted therein. Further, each row 0, row 1, . . . , row N-1 may use multiple corresponding wordlines WLA, WLB, such as, e.g., WLA_0, WLA_1, . . . , WLA_N-1 and WLB_0, WLB_1, . . . , WLB_N-1. The memory circuit 100 may include multiple ports, e.g., a first port A and a second port B. The first port A may be the first word lines WLA corresponding to the first bitlines BLA, NBLA. The second port B may be the second word lines WLB corresponding to the second bitlines BLB, NBLB.

The memory circuitry 100 may include a SRAM bitcell, including a dual port SRAM bitcell. For instance, dual port SRAM may include multiple ports (e.g., port A and port B) through which memory may be written to or read from, and each port may be similar in structure. Some SRAM bitcells may utilize a number of transistors (e.g., four transistors) to form cross-coupled inverters that are configured to store a bit of data with two stable states denoted by 0 and 1. Some SRAM bitcells may utilize a number of transistors (e.g., two transistors for each port in dual port SRAM) to control access to bitcell data during read-write operations. As such, various types of SRAM bitcells may utilize 6, 8, 10, or more transistors per bitcell to store and access each bit of data. In one implementation, a dual port SRAM as described herein may employ an 8 Transistor True Dual port bitcell (8T bitcell), that employs two word lines (WLA for port A and WLB for port B) and two differential bitlines (BLA, NBLA for port A, and BLB and NBLB for port B), as shown in FIG. 1.

The memory circuit 100 may include a column multiplexer (mux) circuit 104 with read-write circuits for multiple ports that may be configured to receive data signals corresponding to each port (e.g., port A, port B). The first port A may be configured to receive first data signals DA as input for the first bitlines BLA, NBLA based on access of the first wordline WLA, and the second port B may be configured to receive second data signals DB as input for the second bitlines BLB, NBLB based on access of the second wordline WLB, which is described further herein. Further, each port A, B may use clock signals (CLKA, CLKB). Although not shown in FIG. 1, each port A, B may use one or more other signals, including, e.g., address bus signals (AA, AB), data-in bus signals (DA, DB), and enable signals (including chip enable signals CENA, CENB and write enable signals WENA, WENB). In some instances, a contention scenario may occur when AA=AB.

The column mux circuit 104 may include a contention override circuit (not shown) that may be configured to provide one or more contention override signals (e.g., COS_A, COS_B) for each port A, B based on detecting a read-write contention between the ports A, B. The contention override circuit may be configured to detect read-write contention when the first and second word lines are accessed at the same time. The contention override circuit is described in more detail in the paragraphs below.

The first port A may include a first read-write circuit 104A having multiple data paths for receiving the first data signals DA and providing the first data signals DA to first bitlines BLA, NBLA based on one or more input signals. For the first port A, the first bitlines BLA, NBLA may include a first non-differential bitline BLA and a first differential bitline NBLA. For the first port A, the one or more input signals may include a first write selection signal YWA and the second contention override signal COS_B. In some instances, YWA may be asserted in a particular cycle, if a low value is sampled by the CLKA in that particular cycle, such as, e.g., when WENA is active low.

The first port A may include multiple data paths including first write paths (not shown) and first contention paths FCP. In the first port A, the first write paths may be configured to provide the first data signals DA as input to the first bitlines BLA, NBLA. For instance, in the first port A, the first write paths may include a pair of first write paths (not shown) including a first non-differential write path for the first non-differential bitline BLA and a first differential write path for the first differential bitline NBLA. From the first port A, one or more contention signals may be exchanged with the second port B via one or more first contention paths, which may include a first contention path FCP and a first differential contention path FDCP. As described further herein, the first contention paths FCP, FDCP may be configured to provide the second data signals DB from the second port B as input to the first bitlines BLA, NBLA of the first port A based on the second contention override signal COS_B.

The second port B may include a second read-write circuit 104B having multiple data paths for receiving the second data signals DB and providing the second data signals DB to second bitlines BLB, NBLB based on one or more input signals. For the second port B, the second bitlines BLB, NBLB may include a second non-differential bitline BLB and a second differential bitline NBLB. For the second port B, the one or more input signals may include a second write selection signal YWB and the first contention override signal COS_A.

The second port B may include multiple data paths including second write paths (not shown) and second contention paths SCP. In the second port B, the second write paths may be configured to provide the second data signals DB as input to the second bitlines BLB, NBLB. For instance, in the second port B, the second write paths may include a pair of second write paths (not shown) including a second non-differential write path for the second non-differential bitline BLB and a second differential write path for the second differential bitline NBLB. From the second port B, one or more contention signals may be exchanged with the first port A via one or more second contention paths, which may include a second contention path SCP and a second differential contention path SDCP. As described further herein, the second contention paths SCP, SDCP may be configured to provide the first data signals DA from the first port A as input to the second bitlines BLB, NBLB of the second port B based on the first contention override signal COS_A.

As described further herein, the write circuits 104A, 104B may include multiple passgates for each port A, B including write passgates and contention passgates for each port A, B. The write passgates may be configured to be input with data signals from corresponding ports (i.e., the same ports). Further, the contention passgates may be configured to be input with data signals from opposing ports (i.e., the opposite ports) based on opposing contention override signals.

In various scenarios, contention may occur when the same memory location is accessed through port A and port B at the same time, e.g., when WLA and WLB are high at the same time. This contention may occur when a row address for port A (e.g., AA) is identical to a row address for port B (e.g., AB). In some instances, contention may include full contention, wherein the row address and the column address are the same for both ports. In other instances, contention may include partial contention, wherein the row address is same for both ports, but the column address is different.

There are multiple ways of handling various contention scenarios. One way is to ensure that a write operation succeeds over a read operation in a manner as shown in the following Table 1:

TABLE 1

| | Port A | Port B | Result of Operation |
| --- | --- | --- | --- |
| 1 | READ | READ | Both Read Succeed |
| 2 | READ | WRITE | Read Fail Write Succeed |
| 3 | WRITE | READ | Read Fail Write Succeed |
| 4 | WRITE | WRITE | Both Write Fail |

In various implementations, the subject matter described herein provides a read-write contention circuitry that is configured to assist with handling the second and third conditions (2, 3) of Table 1 with a reduced impact on the frequency of operation of the memory circuit, such as, e.g., a dual port SRAM bitcell.

Figure 2A:
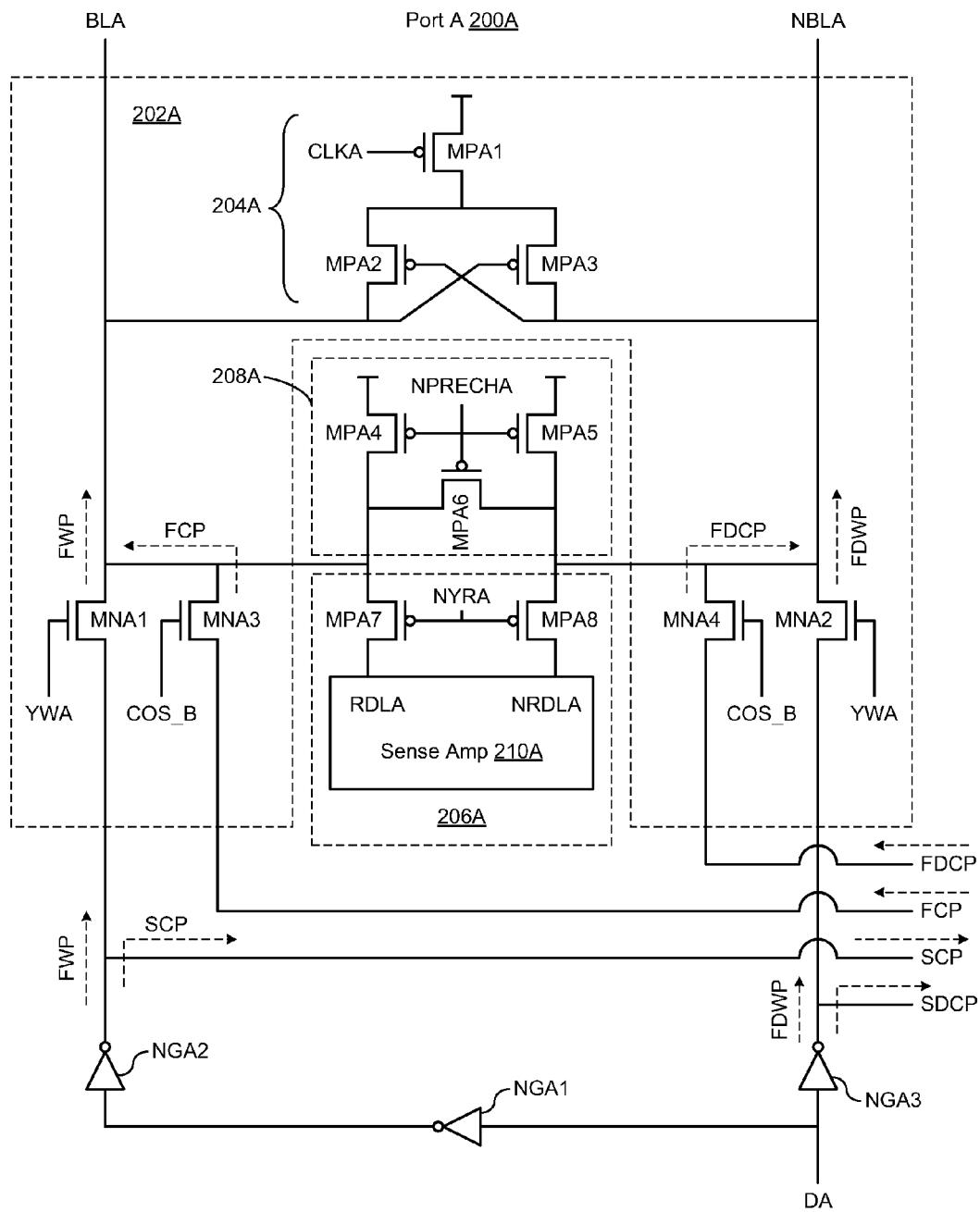
FIGS. 2A-2B illustrate diagrams of read-write contention circuitry in accordance with various implementations described herein.
Figure 2B:
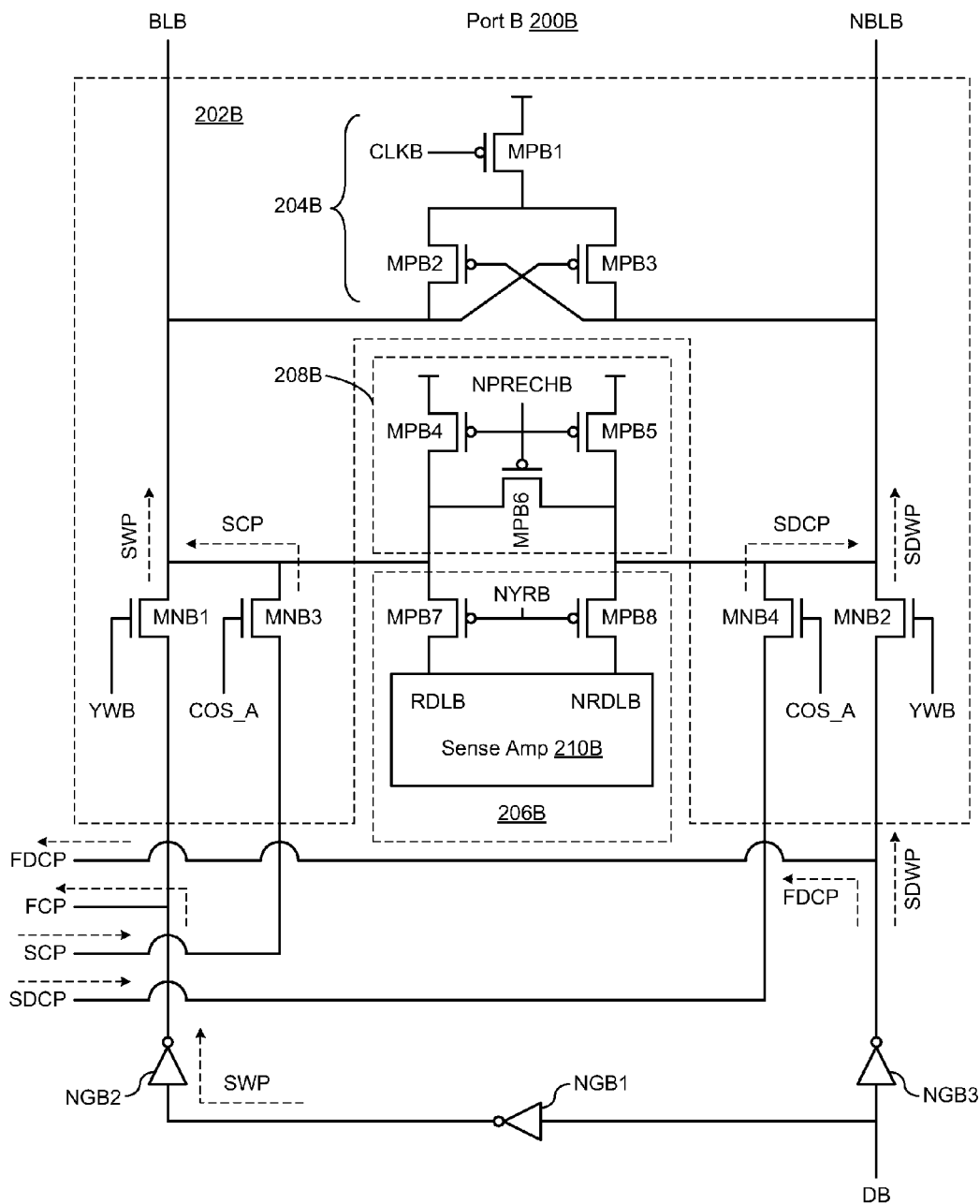
Figure 2C:
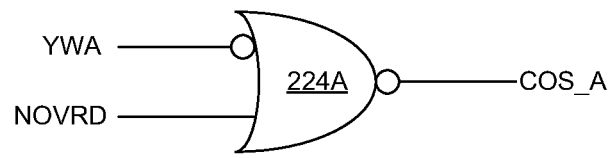
FIG. 2C illustrates a diagram of contention override circuitry in accordance with various implementations described herein.
Figure 2C:
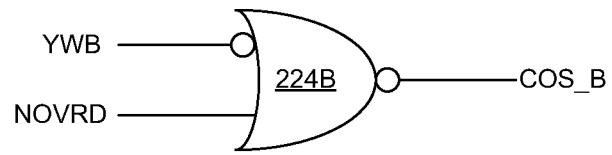

FIGS. 2A-2B illustrate diagrams of read-write contention circuitry in accordance with various implementations described herein. In particular, FIG. 2A illustrates a first portion of a diagram of read-write contention circuitry 200A for a first port (e.g., PORT A) of memory circuit 100, and FIG. 2B illustrates a second portion of a diagram of read-write contention circuitry 200B for a second port (e.g., PORT B) of memory circuit 100). FIG. 2C illustrates a diagram of contention override circuitry 200C in accordance with various implementations described herein.

As shown in FIG. 2A, the first read-write contention circuitry 200A for the first port A may include a first write circuit 202A configured for writing data to the first port A, a first read circuit 206A for reading data from the first port A, and a first pre-charge circuit 208A. As shown in FIG. 2B, the second read-write contention circuitry 200B for the second port B may include a second write circuit 202B configured for writing data to the second port B, a second read circuit 206B for reading data from the second port B, and a second pre-charge circuit 208B. As further shown in FIG. 2B, each of the first and second write circuits 202A, 202B may include multiple data paths for the first port A and the second port B.

For the first read-write contention circuitry 200A, the first write paths may include a first non-differential write path FWP for the first port A and a first differential write path FDWP for the first port A. The first non-differential write path FWP may be referred to as the first write path FWP. In some implementations, the first write path FWP may be parallel to a first contention path FCP, and the first differential write path FDWP may be parallel to the first differential contention path FDCP.

The first write path FWP may provide the first data signal DA as input to a first non-differential bitline BLA of the first port A. In the FWP, the first data signal DA may pass through, e.g., first and second NOT gates NGA1, NGA2 and may then be provided as input to a first passgate MNA1, which may be an n-type metal-oxide-semiconductor (NMOS) transistor. The gate of the first passgate MNA1 may be activated by a first write selection signal YWA during a write cycle. Upon activation, the first data signal DA may pass through the first passgate MNA1 as input via the FWP to the first non-differential bitline BLA of the first port A.

The first write path FWP may provide the first data signal DA to the second port B in a second contention path SCP as input to a second non-differential bitline BLB of the second port B. As shown in FIG. 2A, input of the first data signal DA may be traced along the FWP through the first and second NOT gates NGA1, NGA2 to the SCP. Along the SCP in FIG. 2A, the first data signal DA may be further traced to the second port B in FIG. 2B.

The first differential write path FDWP may provide the first data signal DA as a differential input to a first differential bitline NBLA of the first port A. The differential input may be referred to as an inverted input of the first data signal DA. In the FDWP, the first data signal DA may pass through, e.g., a third NOT gate NGA3 and may then be provided as input to a second passgate MNA2, which may be an NMOS transistor. The gate of the second passgate MNA2 may be activated by the first write selection signal YWA during a write cycle. Upon activation, the differential of the first data signal DA may pass through the second passgate MNA2 as the differential input via the FDWP to the first differential bitline NBLA of the first port A.

The first differential write path FDWP may provide the first data signal DA to the second port B via a second differential contention path SDCP as a differential input to a second differential bitline NBLB of the second port B. As shown in FIG. 2A, input of the first data signal DA may be traced along the FDWP through the third NOT gate NGA3 to the SDCP. Along the SDCP in FIG. 2A, the differential of the first data signal DA may be further traced to the second port B in FIG. 2B.

For the first read-write contention circuitry 200A, the first contention paths may include the first non-differential contention path FCP for the first port A and the first differential contention path FDCP for the first port A. The first non-differential contention path FCP may be referred to as the first contention path FCP. In some implementations, the first contention path FCP may be parallel to the first write path FWP, and the first differential contention path FDCP may be parallel to the first differential write path FDWP.

The first contention path FCP for the first port A may provide the second data signal DB as input to the first non-differential bitline BLA of the first port A based on a second contention override signal COS_B. In the FCP, the second data signal DB may pass from the second port B via a second write path SWP and may then be provided as input to a third passgate MNA3, which may comprise an NMOS transistor. The third passgate MNA3 may be parallel to the first passgate MNA1 to thereby provide parallel paths FCP and FWP. The third passgate MNA3 may be referred to as a first contention passgate for the first port A. The gate of the third passgate MNA3 may be selectively activated by the second contention override signal COS_B during a write cycle. Upon activation, the second data signal DB may pass through the third passgate MNA3 as input via the FCP to the first non-differential bitline BLA of the first port A. The first contention path FCP may combine with the first write path FWP to provide a first bitline path for the first bitline BLA of the first port A.

The first differential contention path FDCP for the first port A may provide the second data signal DB as a differential input to the first differential bitline NBLA of the first port A based on the second contention override signal COS_B. In the FDCP, the second data signal DB may pass from the second port B via a second differential write path SDWP and may then be provided as input to a fourth passgate MNA4, which may be an NMOS transistor. The fourth passgate MNA4 may be parallel to the second passgate MNA2 to provide parallel paths FDCP and FDWP. The fourth passgate MNA4 may be referred to as a second contention passgate for the first port A. The gate of the fourth passgate MNA4 may be selectively activated by the second contention override signal COS_B during a write cycle. Upon activation, the differential of the second data signal DB may pass through the fourth passgate MNA4 as input via the FDCP to the first differential bitline NBLA of the first port A. The first differential contention path FDCP may combine with the first differential write path FDWP to provide a first differential bitline path for the first differential bitline NBLA of the first port A.

The first read-write contention circuitry 200A includes a first cross-coupled circuit 204A having a first PMOS transistor MPA1 and a second PMOS transistor MPA2 cross-coupled with a third PMOS transistor MPA3. The first PMOS transistor MPA1 may receive a gate input from a first clock CLKA. The first cross-coupled circuit 204A may be configured to help with write operations for the first bitlines BLA, NBLA. The first PMOS transistor MPA1 may be configured to selectively activate the cross coupled transistors MPA2, MPA3 for the write port during the write cycles. Further, the first PMOS transistor MPA1 may be configured as a header device that may be used to float the bitlines BLA, NBLA in power saving modes to reduce leakage through the cross-coupled devices.

The first read circuit 206A may be configured for reading data from the first port A. The first read circuit 206A may include multiple PMOS transistors. The multiple PMOS transistors may include multiple read passgates, including a seventh PMOS transistor MPA7 (as a first read passgate) and an eighth PMOS transistor MPA8 (as a second read passgate) configured to receive a read selection input signal NYRA. The first pre-charge circuit 208A may be used for read and write operations. The first pre-charge circuit 208A may include multiple PMOS transistors. The multiple PMOS transistors may include a fourth PMOS transistor MPA4, a fifth PMOS transistor MPA5, and a sixth PMOS transistor MPA6 configured to receive an input signal NPRECHA and provide pre-charge staging circuitry. The signal NPRECHA may be used as a pre-charge signal that is active low. This signal NPRECHA may be used to pre-charge first bitlines BLA and NBLA to VDD before starting read or write operations. This signal may be activated at an end of a cycle to pre-charge in preparation for a next cycle and may be further de-activated at a start of a cycle to perform the read and/or write operations. Further, NYRA may refer to a read passgate select signal, similar to the write passgate select signal YWA. This signal may be active low to activate the PMOS in the read cycles. In some instances, the NYRA, YWA, and NPRECHA signals may be generated in a common CLK block in memory and routed across the column multiplexer.

The first read circuit 206A may include a first sense amplifier circuit 210A that may be configured to provide multiple output signals, including a first output signal RDLA and a differential of the first output signal NRDLA. The first sense amplifier circuit 210A may be configured to be disabled when the second contention override circuit 220B of FIG. 2C detects read-write contention, which is described further herein.

In reference to FIG. 2B, for the second read-write contention circuitry 200B, the second write paths may include a second non-differential write path SWP for the second port B and a second differential write path SDWP for the second port B. The second non-differential write path SWP may be referred to as the second write path SWP. In some implementations, the second write path SWP may be parallel to a second contention path SCP, and the second differential write path SDWP may be parallel to the second differential contention path SDCP.

The second write path SWP may provide the second data signal DB as input to a second non-differential bitline BLB of the second port B. In the SWP, the second data signal DB may pass through, e.g., first and second NOT gates NGB1, NGB2 and may then be provided as input to a first passgate MNB1, which may be an NMOS transistor. The gate of the first passgate MNB1 may be activated by a second write selection signal YWB during a write cycle. Upon activation, the second data signal DB may pass through the first passgate MNB1 as input via the SWP to the second non-differential bitline BLB of the second port B.

The second write path SWP may provide the second data signal DB to the first port A in a first contention path FCP as input to the first non-differential bitline BLA of the first port A. As shown in FIG. 2B, input of the second data signal DB may be traced along the SWP through the first and second NOT gates NGB1, NGB2 to the FCP. Along the FCP in FIG. 2B, the second data signal DB may be further traced to the first port A in FIG. 2A.

The second differential write path SDWP may provide the second data signal DB as a differential input to the second differential bitline NBLB of the second port B. The differential input may be referred to as an inverted input of the second data signal DB. In the SDWP, the second data signal DB may pass through, e.g., a third NOT gate NGB3 and may then be provided as input to a second passgate MNB2, which may be an NMOS transistor. The gate of the second passgate MNB2 may be activated by the second write selection signal YWB during a write cycle. In some instances, upon activation, the differential of the second data signal DB may pass through the second passgate MNB2 as the differential input via the SDWP to the second differential bitline NBLB of the second port B.

The second differential write path SDWP may provide the second data signal DB to the first port A via the first differential contention path FDCP as a differential input to the first differential bitline NBLA of the first port A. As shown in FIG. 2B, input of the second data signal DB may be traced along the SDWP through the third NOT gate NGB3 to the FDCP. Along the FDCP in FIG. 2B, the differential of the second data signal DB may be further traced to the first port A in FIG. 2A.

In reference to FIG. 2B, for the second read-write contention circuitry 200B, the second contention paths may include the second non-differential contention path SCP for the second port B and the second differential contention path SDCP for the second port B. The second non-differential contention path SCP may be referred to as the second contention path SCP. In some implementations, the second contention path SCP may be parallel to the second write path SWP, and the second differential contention path SDCP may be parallel to the second differential write path SDWP.

The second contention path SCP for the second port B may provide the first data signal DA as input to the second non-differential bitline BLB of the second port B based on the first contention override signal COS_A. In the SCP, the first data signal DA may pass from the first port A via the first write path FWP and may then be provided as input to a third passgate MNB3, which may comprise an NMOS transistor. The third passgate MNB3 may be parallel to the first passgate MNB1 to thereby provide parallel paths SCP and SWP. The third passgate MNB3 may be referred to as a first contention passgate for the second port B. The gate of the third passgate MNB3 may be selectively activated by the first contention override signal COS_A during a write cycle. Upon activation, the first data signal DA may pass through the third passgate MNB3 as input via the SCP to the second non-differential bitline BLB of the second port B. The second contention path SCP may combine with the second write path SWP to provide a second bitline path for the second bitline BLB of the second port B.

The second differential contention path SDCP for the second port B may provide the first data signal DA as a differential input to the second differential bitline NBLB of the second port B based on the first contention override signal COS_A. In the SDCP, the first data signal DA may pass from the first port A via the first differential write path FDWP and may then be provided as input to a fourth passgate MNB4, which may be an NMOS transistor. The fourth passgate MNB4 may be parallel to the second passgate MNB2 to thereby provide parallel paths SDCP and SDWP. The fourth passgate MNB4 may be referred to as a second contention passgate for the second port B. The gate of the fourth passgate MNB4 may be selectively activated by the first contention override signal COS_A during a write cycle. Upon activation, the differential of the first data signal DA may pass through the fourth passgate MNB4 as input via the SDCP to the second differential bitline NBLB of the second port B. The second differential contention path SDCP may combine with the second differential write path SDWP to provide a second differential bitline path for the second differential bitline NBLB of the second port B.

The second read-write contention circuitry 200B includes a second cross-coupled circuit 204B having a first PMOS transistor MPB1 and a second PMOS transistor MPB2 cross-coupled with a third PMOS transistor MPB3. The first PMOS transistor MPB1 may receive a gate input from a second clock CLKB. The second cross-coupled circuit 204B may be configured to help with write operations for the second bitlines BLB, NBLB. The first PMOS transistor MPB1 may be configured to selectively activate the cross coupled transistors MPB2, MPB3 for the write port during the write cycles. Further, the first PMOS transistor MPB1 may be configured as a header device that may be used to float the bitlines BLB, NBLB in power saving modes to reduce leakage through the cross-coupled devices.

The second read circuit 206B may be configured for reading data from the second port B. The second read circuit 206B may include multiple PMOS transistors. The multiple PMOS transistors may include multiple read passgates, including a seventh PMOS transistor MPB7 (as a first read passgate) and an eighth PMOS transistor MPB8 (as a second read passgate) configured to receive an input signal NYRB. The second pre-charge circuit 208B may be used for read and write operations. The second pre-charge circuit 208B may include multiple PMOS transistors. The multiple PMOS transistors may include a fourth PMOS transistor MPB4, a fifth PMOS transistor MPB5, and a sixth PMOS transistor MPB6 configured to receive an input signal NPRECHB and provide pre-charge staging circuitry. The signal NRECHB may be used as a pre-charge signal that is active low. This signal NPRECHB may be used to pre-charge second bitlines BLB and NBLB to VDD before starting read or write operations. This signal may be activated at an end of a cycle to pre-charge in preparation for a next cycle and may be further de-activated at a start of a cycle to perform the read and/or write operations. Further, NYRB may refer to a read passgate select signal, similar to the write passgate select signal YWB. This signal may be active low to activate the PMOS in the read cycles. In some instances, the NYRB, YWB, and NPRECHB signals may be generated in a common CLK block in memory and routed across the column multiplexer.

The second read circuit 206B may include a second sense amplifier circuit 210B configured to provide multiple output signals, including a second output signal RDLB and a differential of the second output signal NRDLB. The second sense amplifier circuit 210B may be configured to be disabled when the first contention override circuit 220A of FIG. 2C detects read-write contention, which is described further herein.

FIG. 2C illustrates an example diagram of contention override circuitry 200C in accordance with various implementations described herein. The contention override circuitry 200C may be configured to detect read-write contention and provide the first contention override signal COS_A to the second port B and provide the second contention override signal COS_B to the first port A.

The contention override circuitry 200C may include a first contention override circuit 220A for the first port A. The first contention override circuit 220A may be configured to provide the first contention override signal COS_A. The first contention override circuit 220A may be configured to mix the first write selection signal YWA with a collision override signal NOVRD to generate the first contention override signal COS_A for activating the second contention passgates MNB3, MNB4 during a write cycle. The collision override signal NOVRD may be internally or externally generated when a write condition is sensed for either port A or port B with the address matching for port A and port B. In some implementations, circuitry to generate the NOVRD signal may include a binary comparator to compare address signals AA and AB and trigger the NOVRD signal when AA=AB (e.g., when AA is port A address, and AB is port B address).

The first contention override circuit 220A may include a first NOR gate 224A having multiple inputs and at least one output. The first NOR gate 224A may include a first input as a NOT input configured to receive the first write selection signal YWA. The first NOR gate 224A may include a second input configured to receive the collision override signal NOVRD. The first NOR gate 224A may include the at least one output that provides the first contention override signal COS_A. In some implementations, YWA may be an active high signal and NOVRD may be active low. As such, the NOR gate output may go high (active) when YWA=1 and NOVRD=0. YWA may go high in a write operation, and NOVRD may go low when there is a contention).

The contention override circuitry 200C may include a second contention override circuit 220B for the second port B. The second contention override circuit 220B may be configured to provide the second contention override signal COS_B. The second contention override circuit 220B may also be configured to mix the second write selection signal YWB with the collision override signal NOVRD to generate the second contention override signal COS_B for activating the first contention passgates MNA3, MNA4 during a write cycle. As previously described herein above, the collision override signal NOVRD may be internally or externally generated when a write condition is sensed for either port A or port B with the address matching for port A and port B. In some implementations, circuitry to generate the NOVRD signal may include a binary comparator to compare address signals AA and AB and trigger the OVRD signal when AA=AB (e.g., when AA is port A address, and AB is port B address).

The second contention override circuit 220B may include a second NOR gate 224B having multiple inputs and at least one output. The second NOR gate 224B may include a second input as a NOT input configured to receive the second write selection signal YWB. The second NOR gate 224B may also include a second input configured to receive the collision override signal NOVRD. The second NOR gate 224B may include at least one output that provides the second contention override signal COS_B. In some implementations, YWB may be an active high signal and NOVRD may be active low. As such, the NOR gate output may go high (active) when YWB=1 and NOVRD=0. YWB may go high in a write operation, and NOVRD may go low when there is a contention).

Figure 3A:
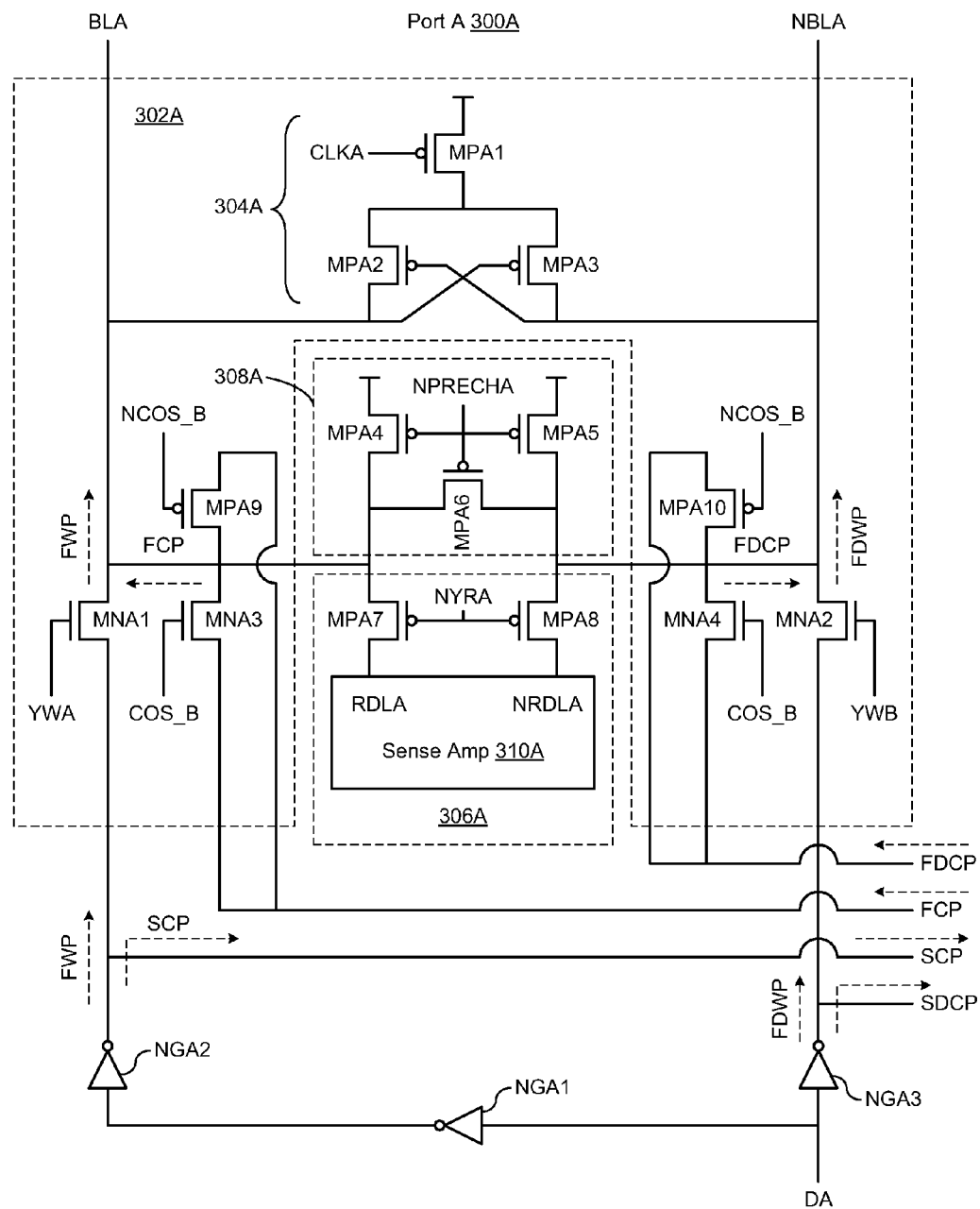
FIGS. 3A-3B illustrate diagrams of read-write contention circuitry in accordance with various implementations described herein.
Figure 3B:
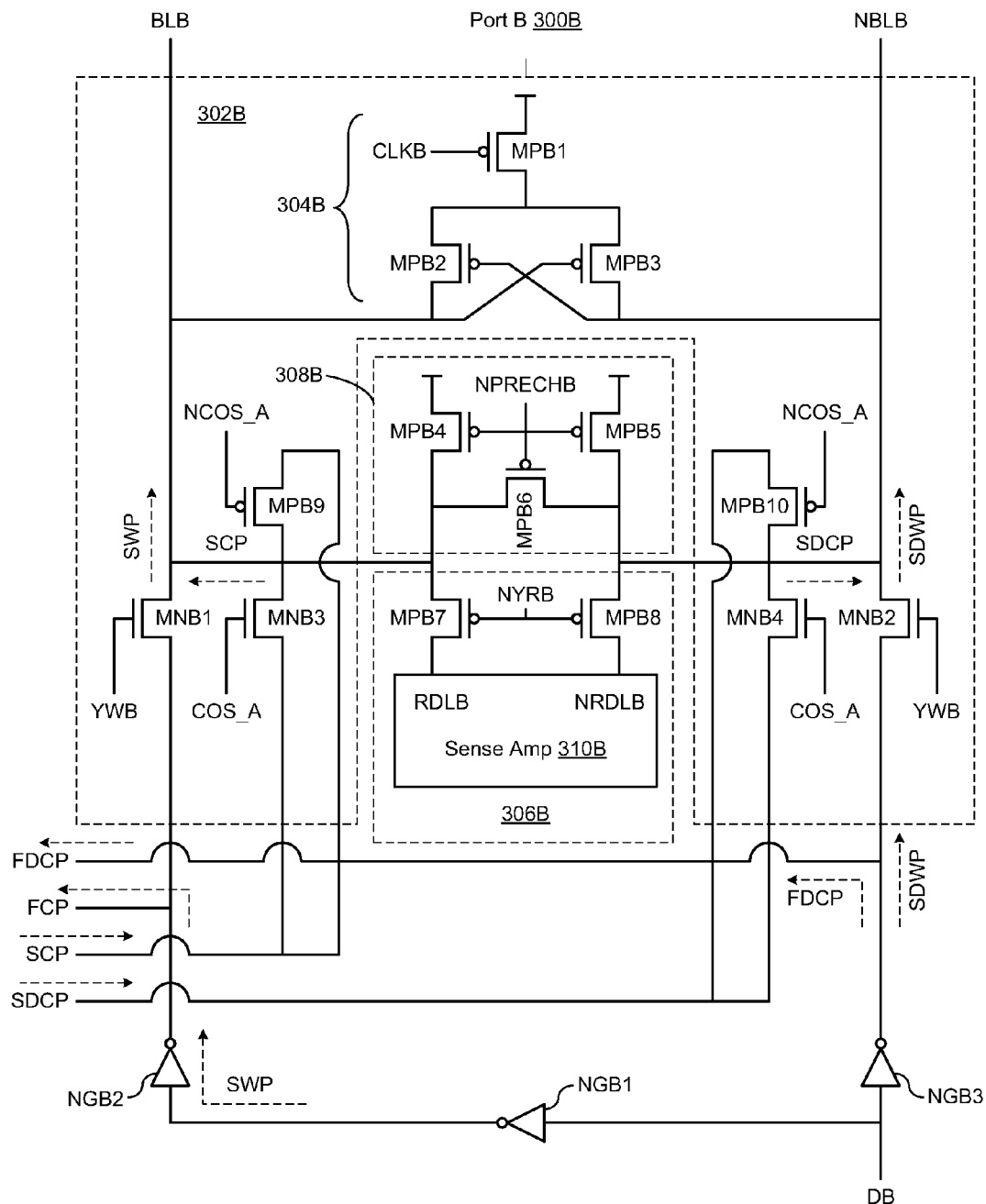
Figure 3C:
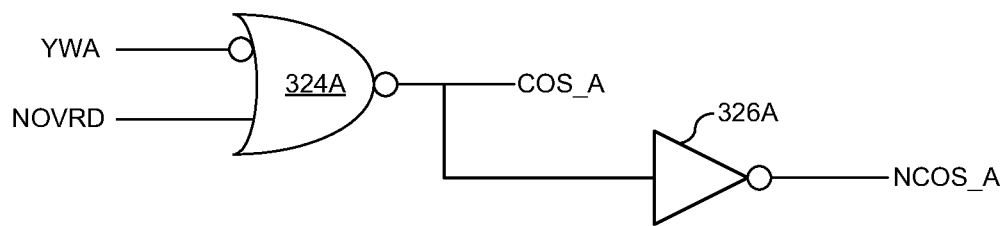
FIG. 3C illustrates a diagram of contention override circuitry in accordance with various implementations described herein.
Figure 3C:
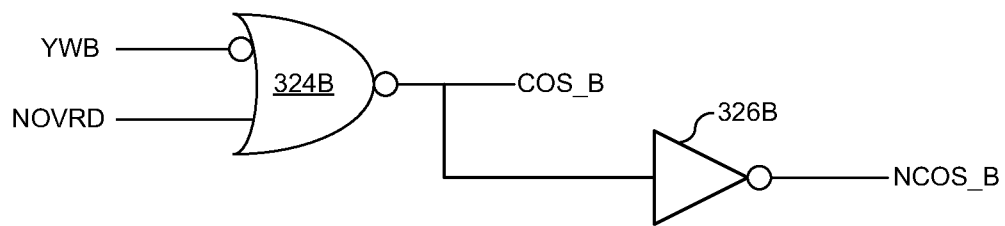

FIGS. 3A-3B illustrate diagrams of read-write contention circuitry in accordance with various implementations described herein. In particular, FIG. 3A illustrates a first portion of a diagram of read-write contention circuitry 300A for a first port A, and FIG. 3B illustrates a second portion of a diagram of read-write contention circuitry 300B for a second port B. Further, FIG. 3C illustrates a diagram of contention override circuitry 300C in accordance with various implementations described herein.

In one implementation, as shown in FIG. 3A, the read-write contention circuitry 300A may be the read-write contention circuitry 200A of FIG. 2A with incorporation of a ninth transistor MPA9, which may be a PMOS transistor, and a tenth passgate MPA10, which may be a PMOS transistor.

In FIG. 3A, the first contention path FCP for the first port A may provide the second data signal DB as input to the first non-differential bitline BLA of the first port A based on a differential of the second contention override signal NCOS_B and COS_B. In the FCP, the second data signal DB may pass from the second port B via a second write path SWP and may then be provided as input to the third passgate MNA3 (NMOS transistor) and the ninth transistor MPA9 (PMOS transistor), which may be used as contention passgates. MPA9 may be in parallel with MNA3, which may render the contention passgate as a full CMOS switch. In some instances, by changing the contention passgate from NMOS to CMOS, this configuration may provide improved performance. The gate of the ninth passgate MPA9 may be selectively activated by the differential of the second contention override signal NCOS_B during a write cycle. Upon activation, the second data signal DB may pass through the ninth passgate MPA9 and third passgate MNA3 as input via the FCP to the first non-differential bitline BLA of the first port A. The first contention path FCP may combine with the first write path FWP to provide a first bitline path for the first bitline BLA of the first port A.

Still with reference to FIG. 3A, the first differential contention path FDCP for the first port A may provide the second data signal DB as a differential input to the first differential bitline NBLA of the first port A based on the differential of the second contention override signal NCOS_B and COS_B. In the FDCP, the second data signal DB may pass from the second port B via a second differential write path SDWP and may then be provided as input to the fourth passgate MNA4 (NMOS transistor) and the tenth passgate MPA10 (PMOS transistor), which may be used as contention passgates. MPA10 may be in parallel with MNA4, which may render the contention passgate as a full CMOS switch. In some instances, by changing the contention passgate from NMOS to CMOS, this configuration may provide improved performance. The gate of the tenth passgate MPA10 may be selectively activated by the differential of the second contention override signal NCOS_B during a write cycle. Upon activation, the differential of the second data signal DB may pass through the tenth passgate MPA10 and fourth passgate MNA4 as input via the FDCP to the first differential bitline NBLA of the first port A. The first differential contention path FDCP may combine with the first differential write path FDWP to provide a first differential bitline path for the first differential bitline NBLA of the first port A.

The first read-write contention circuitry 300A of FIG. 3A includes a first cross-coupled circuit 304A that may operate in a similar manner as with the first cross-coupled circuit 204A of FIG. 2A. Further, the first read-write contention circuitry 300A of FIG. 3A includes a first read circuit 306A that may operate in a similar manner as with the first read circuit 206A of FIG. 2A.

In one implementation, in reference to FIG. 3B, the read-write contention circuitry 300B may be the read-write contention circuitry 200B of FIG. 2B with incorporation of a ninth transistor MPB9, which may be a PMOS transistor, and a tenth passgate MPB10, which may be a PMOS transistor.

In FIG. 3B, the second contention path SCP for the second port B may provide the first data signal DA as input to the second non-differential bitline BLB of the second port B based on a differential of the first contention override signal NCOS_A and COS_A. In the SCP, the first data signal DA may pass from the first port A via a first write path FWP and may then be provided as input to the third passgate MNB3 (NMOS transistor) and the ninth transistor MPB9 (PMOS transistor), which may be used as contention passgates. MPB9 may be in parallel with MNB3, which may render the contention passgate as a full CMOS switch. In some instances, by changing the contention passgate from NMOS to CMOS, this configuration may provide improved performance. The gate of the ninth passgate MPB9 may be selectively activated by the differential of the first contention override signal NCOS_A during a write cycle. Upon activation, the first data signal DA may pass through the ninth passgate MPB9 and third passgate MNB3 as input via the SCP to the second non-differential bitline BLB of the second port B. The second contention path SCP may combine with the second write path SWP to provide a second bitline path for the second bitline BLB of the second port B.

Still with reference to FIG. 3B, the second differential contention path SDCP for the second port B may provide the first data signal DA as a differential input to the second differential bitline NBLB of the second port B based on the differential of the first contention override signal NCOS_A and COS_A. In the SDCP, the first data signal DA may pass from the first port A via a first differential write path FDWP and may then be provided as input to the fourth passgate MNB4 (NMOS transistor) and the tenth passgate MPB10 (PMOS transistor), which may be used as contention passgates. MPB10 may be in parallel with MNB4, which may render the contention passgate as a full CMOS switch. In some instances, by changing the contention passgate from NMOS to CMOS, this configuration may provide improved performance. The gate of the tenth passgate MPB10 may be selectively activated by the differential of the first contention override signal NCOS_A during a write cycle. Upon activation, the differential of the first data signal DA may pass through the tenth passgate MPB10 and the fourth passgate MNB4 as input via the SDCP to the second differential bitline NBLB of the second port B. The second differential contention path SDCP may combine with the second differential write path SDWP to provide a second differential bitline path for the second differential bitline NBLB of the second port B.

The second read-write contention circuitry 300B of FIG. 3B includes a first cross-coupled circuit 304B that may operate in a similar manner as with the second cross-coupled circuit 204B of FIG. 2B. Further, the second read-write contention circuitry 300B of FIG. 3B includes a second read circuit 306B that may operate in a similar manner as with the second read circuit 206B of FIG. 2B.

FIG. 3C illustrates an example diagram of contention override circuitry 300C in accordance with various implementations described herein. The contention override circuitry 300C may be configured to detect read-write contention and provide the first contention override signal COS_A to the second port B and provide the differential of the first contention override signal NCOS_A to the second port B. The contention override circuitry 300C may be configured to provide the second contention override signal COS_B to the first port A and provide the differential of the second contention override signal NCOS_B to the first port A.

The contention override circuitry 300C may include a first contention override circuit 320A for the first port A. The first contention override circuit 320A may be configured to provide the first contention override signal COS_A. The first contention override circuit 320A may be configured to mix the first write selection signal YWA with a collision override signal NOVRD to generate the first contention override signal COS_A for activating the second contention passgates MNB3, MNB4 during a write cycle. The collision override signal NOVRD may be internally or externally generated when a write condition is sensed for either port A or B with the address matching for port A and port B. The first contention override signal COS_A may further pass through a first NOT gate 326A to provide the differential of the first contention override signal NCOS_A for activating the third contention passgates MPB9, MPB10 during a write cycle.

The first contention override circuit 320A may include a first NOR gate 324A having multiple inputs and at least one output. The first NOR gate 324A may include a first input as a NOT input configured to receive the first write selection signal YWA. The first NOR gate 324A may include a second input configured to receive the collision override signal NOVRD. The first NOR gate 324A may include the at least one output that provides the first contention override signal COS_A and further provides the differential of the first contention override signal NCOS_A via the first NOT gate 326A. In some implementations, YWA may be an active high signal and NOVRD may be active low. As such, the NOR gate output may go high (active) when YWA=1 and NOVRD=0. YWA may go high in a write operation, and NOVRD may go low when there is a contention).

The contention override circuitry 300C may include a second contention override circuit 320B for the second port B. The second contention override circuit 320B may be configured to provide the second contention override signal COS_B. The second contention override circuit 320B may be configured to mix the second write selection signal YWB with the collision override signal NOVRD to generate the second contention override signal COS_B for activating the first contention passgates MNA3, MNA4 during a write cycle. The collision override signal NOVRD may be internally or externally generated when a write condition is sensed for either port A or B with the address matching for port A and port B. The second contention override signal COS_B may further pass through a second NOT gate 326B to provide the differential of the second contention override signal NCOS_B for activating the third contention passgates MPA9, MPA10 during a write cycle.

The second contention override circuit 320B may include a second NOR gate 324B having multiple inputs and at least one output. The second NOR gate 324B may include a second input as a NOT input configured to receive the second write selection signal YWB. The second NOR gate 324B may include a second input configured to receive the collision override signal NOVRD. The second NOR gate 324B may include the at least one output that provides the second contention override signal COS_B and further provides the differential of the second contention override signal NCOS_B via the second NOT gate 326B. In some implementations, YWB may be an active high signal and NOVRD may be active low. As such, the NOR gate output may go high (active) when YWB=1 and NOVRD=0. YWB may go high in a write operation, and NOVRD may go low when there is a contention).

Figure 4A:
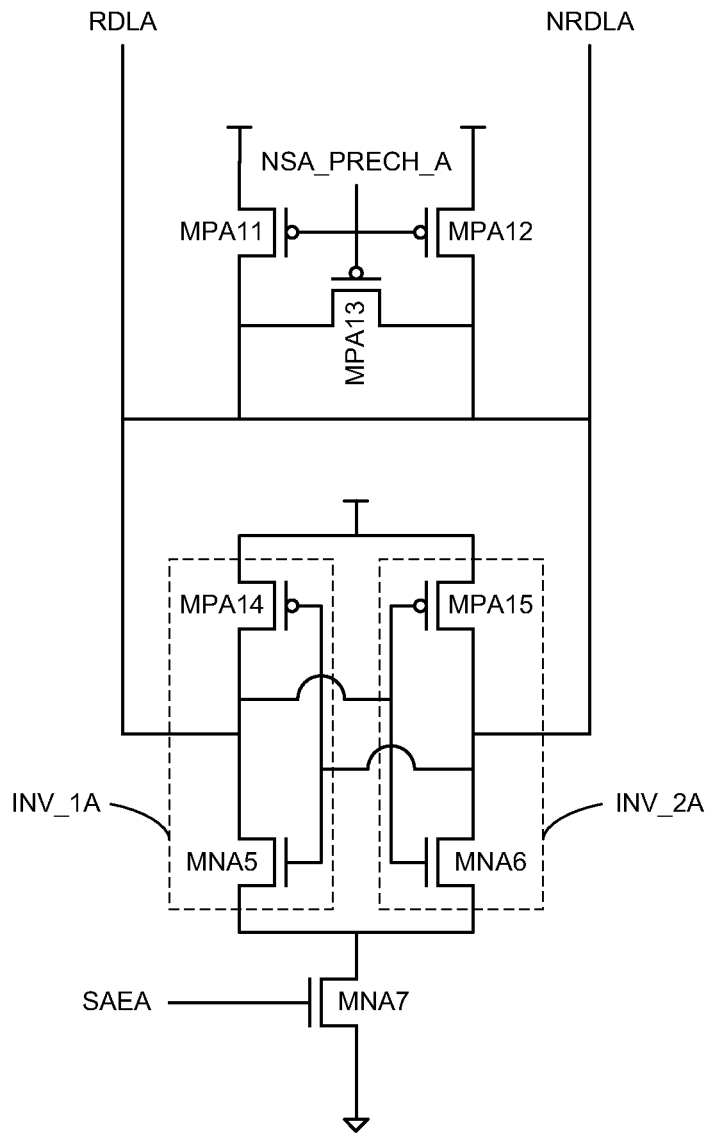
FIGS. 4A-4B illustrate diagrams of sense amplifier circuitry in accordance with various implementations described herein.
Figure 4B:
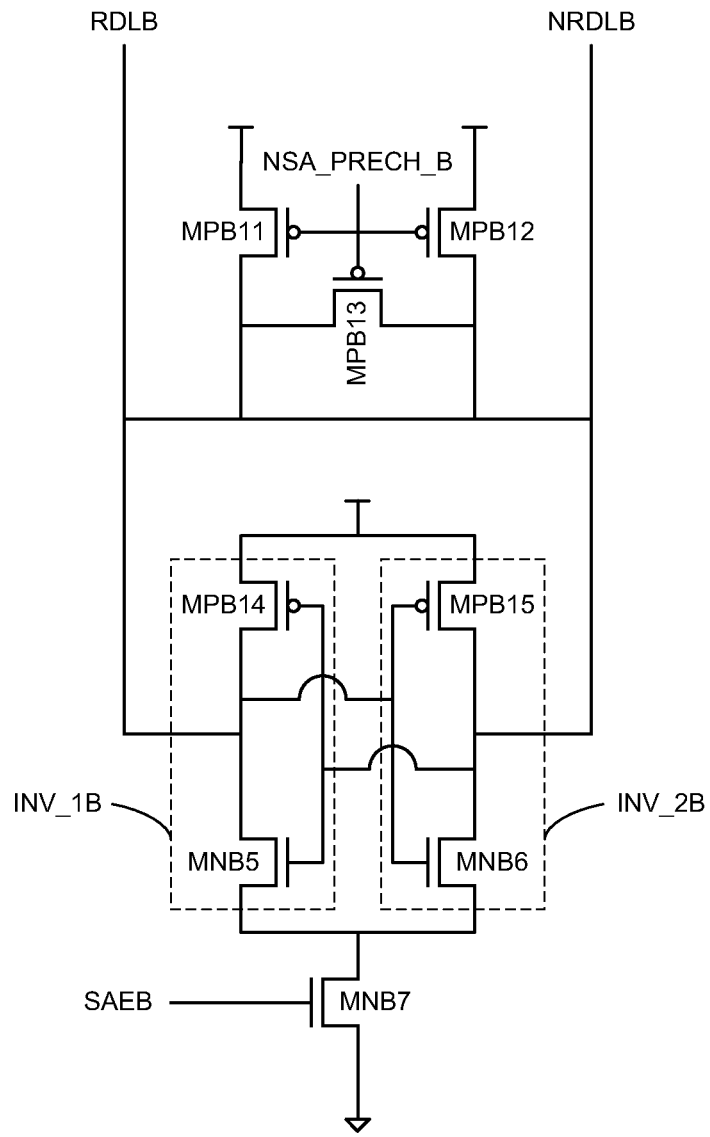

FIGS. 4A-4B illustrate diagrams of sense amplifier circuitry 400A, 400B in accordance with various implementations described herein. In particular, FIG. 4A illustrates a diagram of first sense amplifier circuitry 400A including a first sense amplifier circuit 410A, which may be implemented for use as the sense amplifier circuit 210A of FIG. 2A and/or the sense amplifier circuit 310A of FIG. 3A. Further, FIG. 4B illustrates a diagram of second sense amplifier circuitry 400B including a second sense amplifier circuit 410B, which may be implemented for use as the sense amplifier circuit 210B of FIG. 2B and/or the sense amplifier circuit 310B of FIG. 3B.

In reference to FIG. 4A, the first sense amplifier 410A may be configured to amplify a voltage differential applied to an input lines RDLA and NRDLA and when enabled through a first enable signal SAEA. The first sense amplifier circuit 410A may include two cross-coupled inverters INV_1A (including PMOS transistor MPA14 and NMOS transistor MNA5) and INV_2A (including PMOS transistor MPA15 and NMOS transistor MNA6) with a sink NMOS transistor MNA7 using the first enable signal SAEA applied to its gate.

The first sense amplifier circuit 410A may be used in a read path of the memory. During a read operation, a voltage differential may be developed between BLA and NBLA by a bitcell (e.g., SRAM cell). The first sense amplifier circuit 410A may be used to amply a differential developed by the bitcell to speed up the read operation. This differential may be applied to the sense amplifier inputs RDLA, NRDLA through read mux gates (e.g., PMOS gates MPA7 and MPA8 of FIG. 2A). When enough differential is developed across RDLA and NRDLA, the enable signal SAEA is asserted (e.g., made HIGH), and this enable signal SAEA provides positive feedback action in the cross-coupled inverter arrangement of INV_1A and INV_2A. Further, this amplifies the voltage differential at the input to full rail (VDD) split. This full rail split in voltage may be in a same direction in which the input RDLA and NRDLA differential was applied. Once full rail differential is generated by the first sense amplifier circuit 410A, operation is done. In some instances, if RDLA was at 1V and NRDLA was at 900 mV (e.g., 100 mV differential is generated by the bitcell or SRAM cell), after sense amplifier is enabled with SAEA, RDLA may be at 1V and NRDLA may go to 0V level.

In some implementations, transistors MPA11 and MPA12 are pre-charge devices for RDLA and NRDLA, which may be enabled by NSA_PRECH_A going low. Further, transistor MPA13 may be implemented as an equalizing device. This circuit is having the same functionality as MPA4, MPA5, MPA6 of FIG. 2A, which are pre-charge devices for BLA and NBLA.

In reference to FIG. 4B, the second sense amplifier 410B may be configured to amplify a voltage differential applied to an input lines RDLB and when enabled through a second enable signal SAEB. The second sense amplifier circuit 410B may include two cross-coupled inverters INV_1B (including PMOS transistor MPB14 and NMOS transistor MNB5) and INV_2B (including PMOS transistor MPB15 and NMOS transistor MNB6) with a sink NMOS transistor MNB7 using the second enable signal SAEB applied to its gate.

The second sense amplifier circuit 410B may be used in a read path of the memory. During a read operation, a voltage differential may be developed between BLB and NBLB by a bitcell (e.g., SRAM cell). The second sense amplifier circuit 410B may be used to amply a differential developed by the bitcell to speed up the read operation. This differential may be applied to the sense amplifier inputs RDLB, NRDLB through read mux gates (e.g., PMOS gates MPB7 and MPB8 of FIG. 2B). When enough differential is developed across RDLB and NRDLB, the enable signal SAEB is asserted (e.g., made HIGH), and this enable signal SAEB provides positive feedback action in the cross-coupled inverter arrangement of INV_1B and INV_2B. Further, this amplifies the voltage differential at the input to full rail (VDD) split. This full rail split in voltage may be in a same direction in which the input RDLB and NRDLB differential was applied. Once full rail differential is generated by the second sense amplifier circuit 410B, operation is done. In some instances, if RDLB was at 1V and NRDLB was at 900 mV (e.g., 100 mV differential is generated by the bitcell or SRAM cell), after sense amplifier is enabled with SAEB, RDLB may be at 1V and NRDLB may go to 0V level.

In some implementations, transistors MPB11 and MPB12 are pre-charge devices for RDLB and NRDLB, which may be enabled by NSA_PRECH_B going low. Further, transistor MPB13 may be implemented as an equalizing device. This circuit is having the same functionality as MPB4, MPB5, MPB6 of FIG. 2B, which are pre-charge devices for BLB and NBLB.

In one implementation, suppose there is a skew between CLKA and CLKB, and suppose port A is configured to do a read operation and port B is configured to do a write operation, and further suppose the sense amplifier 210A is fired for port A during the same time the write starts on port B. In this scenario, the flipped sense amplifier data may be exposed to the bitlines of port B (i.e., BLB, NBLB) and also through the bitcell. This may create a fight between the sense amplifier of port A (i.e., 210A in FIG. 2A) and the write drivers of port B (i.e., NGB2, NGB3 in FIG. 2B). Further, this may refer to a contention scenario, and port B data DB may be pushed to BLA and NBLA through the port A contention pass gates (i.e., MNA3 and MNA4 in FIG. 2A). The contention pass gates of port A plus the write driver of port B may compete with the sense amplifier of port A to perform the write operation. In some instances, the write operation may have to wait until the sense amplifier is disabled to drive proper data to its bitlines. To avoid such condition, the sense amplifier enable signal may be terminated when a contention is detected. Since the read may not be guaranteed when there is a contention, this may not affect the functionality. The sense amplifier enable signal may be disabled when there is a contention.

In summary, to overcome deficiencies of conventional techniques, a parallel path (contention passgate) may be added to a write path (write passgate). In this instance, data coming from an opposite port may be used to selectively activate the parallel path with a contention override signal. This technique may be used to resolve any bottleneck on the write passgate. The introduction of the parallel path mux with the opposite data input may be used to reduce the write time during collision.

For instance, as shown in FIG. 2A, the write passgates MNA1, MNA2 of the first port A may be used as normal write passgates, and the contention passgates MNA3, MNA4 of the first port A may be used as parallel path passgates. The write passgates MNA1, MNA2 may be input with the data DA from the same (corresponding) port A, and the contention passgates MNA3, MNA4 may be input with the data DB from the opposite port B. The write passgates MNA1, MNA2 may be activated during a normal write cycle. The collision override signal NOVRD may be generated and mixed with the write selection signal YWA to generate the activation signal (i.e., contention override signal COS_B for the contention passgates MNA3, MNA4.)

In reference to FIG. 2A, the read-write circuit 200A for port A may operate in a manner as follows. Suppose there is a contention between port A and port B with a read from port A and write to port B. For a duration in which internal clocks of port A and port B overlap, the NOVRD signal may go low. YWB is the write mux selection signal (inverted) for port B and YWA is the corresponding signal for port A. YWB may go high because of the write on port B. YWA may remain low because of the read on port A. This may make COS_B to go high and COS_A to remain low. COS_B may be the activate signal for the collision passgates MNA3, MNA4 for port A. In this instance, the port B data DB maybe written to port A through the contention passgates MNA3, MNA4, and the port B data DB may be written to port B through the normal write passgate MNB1, MNB2. Since both ports A, B are being written through, the write time may be faster (or at least somewhat faster) than the write time if there is no collision, and the penalty on the cycle-time due to collision may be removed by the read-write circuit 200A of FIG. 2A. For dual port memory, the cycle-time may be reduced by the read-write contention. Further, the bottleneck may be removed, and the memory is allowed to operate at a frequency that may be equal or at least close to frequency of the non-contention condition, even in the presence of contention.

Figure 5:
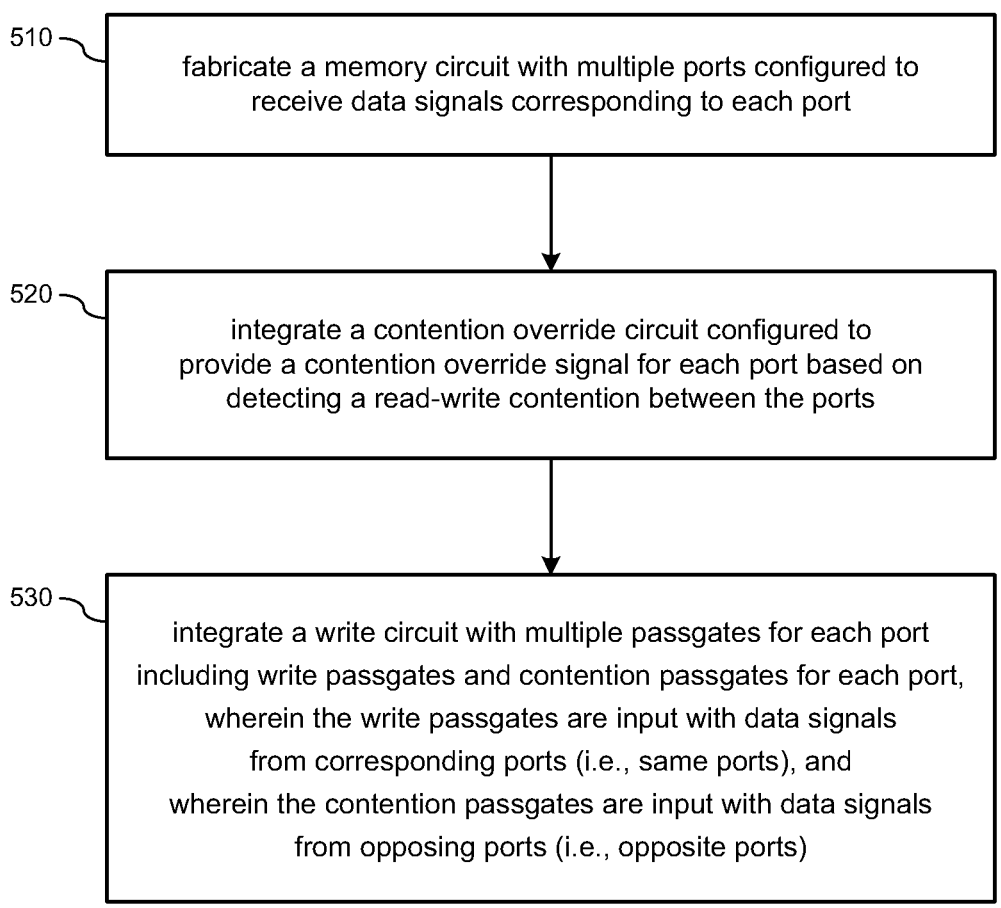
FIG. 5 illustrates a process flow diagram for a method of manufacture of read-write contention circuitry in accordance with various implementations described herein.

FIG. 5 illustrates a process flow diagram for a method 500 of manufacture of read-write contention circuitry in accordance with various implementations described herein. It should be understood that while method 500 indicates a particular order of execution of operations, in some examples, certain portions of the operations might be executed in a different order, and on different systems. In some other examples, one or more additional operations and/or steps may be added to method 500. Similarly, some operations and/or steps may be omitted.

Steps 510-530 are described with reference to FIGS. 2A-2C. At block 510, method 500 may fabricate a memory circuit with multiple ports configured to receive data signals corresponding to each port. The multiple ports may include a first port (e.g., port A) and a second port (e.g., port B). The first port may include a first pair of bitlines including a first non-differential bitline (e.g., BLA) and a first differential bitline (e.g., NBLA). The second port may include a second pair of bitlines including a second non-differential bitline (e.g., BLB) and a second differential bitline (e.g., NBLB).

Step 520 is described with reference to FIG. 2C. At block 520, method 500 may integrate a contention override circuit configured to provide a contention override signal for each port based on detecting a read-write contention between the ports. The contention override circuit may be configured to mix a write selection signal with a collision override signal to generate the contention override signal during the write cycle. The collision override signal may be generated when a write condition is sensed for any one of the ports and/or if the address of both ports match.

Step 530 is described with reference to FIGS. 2A-2B. At block 530, method 500 may integrate a write circuit with multiple passgates for each port including write passgates and contention passgates for each port. The write passgates may be input with data signals from corresponding ports (i.e., same ports), and the contention passgates may be input with data signals from opposing ports (i.e., opposite ports), which may be based on contention override signals.

In some implementations, the write passgates for the first port may include a first pair of write passgates. The first pair of write passgates may be configured to provide a first pair of data signals to a first pair of bitlines of the first port based on a first write selection signal. In some implementations, the contention passgates for the first port may include a first pair of contention passgates in parallel with the first pair of write passgates. The first pair of contention passgates may be configured to provide a second pair of data signals from the second port to the first pair of bitlines of first port based on a second contention override signal.

In some implementations, the write passgates for the second port may include a second pair of write passgates. The second pair of write passgates may be configured to provide a second pair of data signals to a second pair of bitlines of the second port based on a second write selection signal. The contention passgates for the second port may include a second pair of contention passgates in parallel with the second pair of write passgates. The second pair of contention passgates may be configured to provide a first pair of data signals from the first port to the second pair of bitlines of second port based on a first contention override signal.

Described herein are various implementations of an integrated circuit. In one implementation, the integrated circuit may include a memory circuit having multiple ports for accessing and storing data. The multiple ports may include a first port configured to receive first data signals and a second port configured to receive second data signals. The integrated circuit may include a contention override circuit configured to detect read-write contention and provide a first contention override signal and a second contention override signal. The integrated circuit may include a write circuit configured for writing data to the memory circuit. The write circuit may have multiple data paths for the first and second ports. The multiple data paths may include first write paths for the first port, and the first write paths may provide the first data signals as input to first bitlines of the first port. The multiple data paths may include first contention paths for the first port, and the first contention paths may provide the second data signals as input to the first bitlines of the first port based on the second contention override signal. The multiple data paths may include second write paths for the second port, and the second write paths may provide the second data signals as input to second bitlines of the second port. The multiple data paths may include second contention paths for the second port, and the second contention paths may provide the first data signals as input to the second bitlines of the second port based on the first contention override signal.

Described herein are various implementations of an integrated circuit. In one implementation, the integrated circuit may include a static random access memory bitcell having a first port and a second port. The first port may be configured to receive first data signals via first bitlines, and the second port may be configured to receive second data signals via second bitlines. The integrated circuit may include a contention override circuit configured to detect read-write contention and provide a first contention override signal and a second contention override signal. The integrated circuit may include a write circuit configured for writing data to the memory circuit. The write circuit may have multiple passgates including first write passgates in parallel with first contention passgates. The first write passgates may be configured to input the first data signals to the first bitlines of the first port during a write cycle. The first contention passgates may be configured to input the second data signals to the first bitlines of the first port during the write cycle based on the second contention override signal. The write circuit may have multiple passgates including second write passgates in parallel with second contention passgates. The second write passgates may be configured to input the second data signals to the second bitlines of the second port during the write cycle. The second contention passgates may be configured to input the first data signals to the second bitlines of the second port during the write cycle based on the first contention override signal.

Described herein are various implementations of an integrated circuit. In one implementation, the integrated circuit may include a memory circuit having multiple ports configured to receive data signals corresponding to each port. The integrated circuit may include a contention override circuit providing a contention override signal for each port based on detecting a read-write contention between the ports. The integrated circuit may include a write circuit having multiple passgates for each port including write passgates and contention passgates for each port. The write passgates may be input with data signals from corresponding ports. The contention passgates may be input with data signals from opposing ports based on opposing contention override signals.

The discussion provided herein is directed to certain specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory circuit having multiple ports for accessing and storing data, the multiple ports including a first port configured to receive first data signals and a second port configured to receive second data signals;

a contention override circuit configured to detect read-write contention and provide a first contention override signal and a second contention override signal; and a write circuit configured for writing data to the memory circuit, the write circuit having multiple data paths for the first and second ports, the multiple data paths including:

first write paths for the first port, the first write paths providing the first data signals as input to first bitlines of the first port, first contention paths for the first port, the first contention paths providing the second data signals as input to the first bitlines of the first port based on the second contention override signal, second write paths for the second port, the second write paths providing the second data signals as input to second bitlines of the second port, and second contention paths for the second port, the second contention paths providing the first data signals as input to the second bitlines of the second port based on the first contention override signal.

2. The integrated circuit of claim 1, wherein the memory circuit comprises a dual port static random access memory (SRAM) bitcell circuit.

3. The integrated circuit of claim 1, wherein:
the first port comprises first word lines corresponding to the first bitlines,
the second port comprises second word lines corresponding to the second bitlines, and
the contention override circuit is configured to detect read-write contention when the first and second word lines are accessed at the same time.

4. The integrated circuit of claim 1, wherein:
the first bitlines comprise a first non-differential bitline and a first differential bitline, and
the first write paths include a pair of first write paths having a first non-differential write path for the first non-differential bitline and a first differential write path for the first differential bitline.

5. The integrated circuit of claim 1, wherein:
the second bitlines comprise a second non-differential bitline and a second differential bitline, and
the second write paths include a pair of second write paths having a second non-differential write path for the second non-differential bitline and a second differential write path for the second differential bitline.

6. The integrated circuit of claim 1, wherein each contention path is parallel to each write path for each port.

7. The integrated circuit of claim 1, wherein:
the first write paths and the first contention paths are combined to provide first bitline paths for the first bitlines of the first port, and
the second write paths and the second contention paths are combined to provide a second bitline path for the second bitlines of the second port.

8. The integrated circuit of claim 1, wherein:
each write path includes a write passgate that is activated with a write selection signal during a write cycle, and
each contention path includes one or more contention passgates that are selectively activated with the contention override signal during the write cycle.

9. The integrated circuit of claim 8, wherein the contention override circuit is configured to mix the write selection signal with a collision override signal to generate the contention override signal for activating the contention passgate during the write cycle.

10. The integrated circuit of claim 9, wherein the collision override signal is externally generated when a write condition is sensed for both ports at the same time.

11. The integrated circuit of claim 1, further comprising a read circuit for reading data from the memory circuit, the read circuit including:
a first sense amplifier circuit for the first port and a second sense amplifier circuit for the second port, each sense amplifier being configured to be disabled when the contention override circuit detects read-write contention.

12. An integrated circuit, comprising:
a static random access memory bitcell having a first port and a second port, the first port being configured to receive first data signals via first bitlines, the second port being configured to receive second data signals via second bitlines;
a contention override circuit configured to detect read-write contention and provide a first contention override signal and a second contention override signal; and
a write circuit configured for writing data to the memory circuit, the write circuit having multiple passgates including:
first write passgates in parallel with first contention passgates, the first write passgates being configured to input the first data signals to the first bitlines of the first port during a write cycle, and the first contention passgates being configured to input the second data signals to the first bitlines of the first port during the write cycle based on the second contention override signal, and
second write passgates in parallel with second contention passgates, the second write passgates configured to input the second data signals to the second bitlines of the second port during the write cycle, and the second contention passgates configured to input the first data signals to the second bitlines of the second port during the write cycle based on the first contention override signal.

13. The integrated circuit of claim 12, wherein:
the first bitlines for the first port comprise a first pair of bitlines having a first non-differential bitline and a first differential bitline, and
the second bitlines for the second port comprise a second pair of bitlines having a second non-differential bitline and a second differential bitline.

14. The integrated circuit of claim 13, wherein:
the first write passgates for the first port comprise a first pair of write passgates, the first pair of write passgates providing a first non-differential data signal and a first differential data signal as input to the first non-differential bitline and the first differential bitline, respectively, based on a first write selection signal, and
the first contention passgates for the first port comprise a first pair of contention passgates in parallel with the first pair of write passgates, the first pair of contention passgates providing a second non-differential data signal and a second differential data signal as input from the second port to the first non-differential bitline and the first differential bitline, respectively, based on a second contention override signal.

15. The integrated circuit of claim 13, wherein:
the second write passgates for the second port comprise a second pair of write passgates, the second pair of write passgates providing a second non-differential data signal and a second differential data signal as input to the second non-differential bitline and the second differential bitline, respectively, based on a second write selection signal, and the second contention passgates for the second port comprise a second pair of contention passgates in parallel with the second pair of write passgates, the second pair of contention passgates providing a first non-differential data signal and a first differential data signal as input from the first port to the second non-differential bitline and the second differential bitline, respectively, based on a second contention override signal.

16. An integrated circuit, comprising:
a memory circuit having multiple ports configured to receive data signals corresponding to each port;
a contention override circuit providing a contention override signal for each port based on detecting a read-write contention between the ports; and
a write circuit having multiple passgates for each port having write passgates and contention passgates for each port, wherein:
the write passgates are input with data signals from corresponding ports, and
the contention passgates are input with data signals from opposing ports based on opposing contention override signals.

17. The integrated circuit of claim 16, wherein the memory circuit comprises a static random access memory (SRAM) bitcell circuit.

18. The integrated circuit of claim 16, wherein:
the multiple ports comprise a first port and a second port,
the first port comprises a first pair of bitlines including a first non-differential bitline and a first differential bitline, and
the second port comprises a second pair of bitlines including a second non-differential bitline and a second differential bitline.

19. The integrated circuit of claim 18, wherein:
the write passgates for the first port comprise a first pair of write passgates, the first pair of write passgates providing a first pair of data signals to a first pair of bitlines of the first port based on a first write selection signal, and
the contention passgates for the first port comprise a first pair of contention passgates in parallel with the first pair of write passgates, the first pair of contention passgates providing a second pair of data signals from the second port to the first pair of bitlines of first port based on a second contention override signal.

20. The integrated circuit of claim 18, wherein:
the write passgates for the second port comprise a second pair of write passgates, the second pair of write passgates providing a second pair of data signals to a second pair of bitlines of the second port based on a second write selection signal, and
the contention passgates for the second port comprise a second pair of contention passgates in parallel with the second pair of write passgates, the second pair of contention passgates providing a first pair of data signals from the first port to the second pair of bitlines of second port based on a first contention override signal.

* * * * *